United States Patent
Brewer et al.

(10) Patent No.: US 7,485,499 B2
(45) Date of Patent: Feb. 3, 2009

(54) CUSTOMIZED NON-VOLATILE MEMORY DEVICE PACKAGES

(75) Inventors: Wesley G. Brewer, Menlo Park, CA (US); Eric Bone, San Mateo, CA (US)

(73) Assignee: Sandisk Corporation, Milpitas, CA (US)

( * ) Notice: Subject to any disclaimer, the term of this patent is extended or adjusted under 35 U.S.C. 154(b) by 177 days.

(21) Appl. No.: 10/909,575

(22) Filed: Jul. 29, 2004

(65) Prior Publication Data

US 2006/0038023 A1    Feb. 23, 2006

(51) Int. Cl.
    *H01L 21/50*      (2006.01)
    *H01L 21/48*      (2006.01)
    *H01L 21/44*      (2006.01)
    *H01R 13/44*      (2006.01)
    *H01R 13/60*      (2006.01)
    *H05K 7/02*      (2006.01)
    *G06K 7/10*      (2006.01)
(52) U.S. Cl. .............. 438/125; 438/106; 438/126; 439/131; 439/138; 439/148; 361/752; 235/457
(58) Field of Classification Search .......... 438/106, 438/125, 126; 439/131, 138, 148; 361/752; 235/457
See application file for complete search history.

(56) References Cited

U.S. PATENT DOCUMENTS

| 5,327,371 | A | 7/1994 | Maruyama et al. |
| 5,505,628 | A | 4/1996 | Ramey et al. |
| 5,627,729 | A | 5/1997 | Oldendorf et al. |
| 5,720,158 | A | 2/1998 | Goade, Sr. |
| 5,887,145 | A | 3/1999 | Harari et al. |
| 6,513,720 | B1 | 2/2003 | Armstrong |
| 6,522,534 | B1 | 2/2003 | Wu |
| 6,594,154 | B1 * | 7/2003 | Brewer et al. ........... 361/801 |
| 6,612,853 | B2 | 9/2003 | Wu |
| 6,632,997 | B2 * | 10/2003 | Hoffman et al. ........ 174/527 |
| 6,763,410 | B2 | 7/2004 | Yu |
| 6,924,996 | B2 * | 8/2005 | Sugawara ............... 365/51 |

(Continued)

FOREIGN PATENT DOCUMENTS

BR      9510577      1/1999

(Continued)

OTHER PUBLICATIONS

ISA/EPO, "Notification of Transmittal of the International Search Report and the Written Opinion of the International Searching Authority, or the Declaration", mailed in corresponding International Application No. PCT/US2005/026604 mailed Dec. 28, 2005, 12 pages.

(Continued)

*Primary Examiner*—Luan C Thai
(74) *Attorney, Agent, or Firm*—Davis Wright Tremaine LLP

(57) ABSTRACT

Non-volatile data memory cards, flash drives and other memory devices are customized by manufacturing core memory units all the same and then covering them by outer skins which may be made to have different appearances and/or tactile characteristics. The skins are slid over the core memory units by hand from one end. End users of such memory devices may then select how they will look and feel by separately purchasing covers. Sellers of such memory devices may more easily control how their products look and feel.

17 Claims, 3 Drawing Sheets

U.S. PATENT DOCUMENTS

| | | |
|---|---|---|
| 6,999,322 B1 | 2/2006 | Lin |
| 2001/0005902 A1 | 6/2001 | Bacon et al. |
| 2001/0036524 A1 | 11/2001 | Anderson |
| 2004/0040871 A1 | 3/2004 | Kakinoki et al. |
| 2007/0127281 A1 | 6/2007 | Brewer et al. |

FOREIGN PATENT DOCUMENTS

| | | |
|---|---|---|
| EP | 0 691 625 A1 | 1/1996 |
| EP | 1 030 266 A2 | 8/2000 |
| JP | 2000-113663 | 4/2000 |
| WO | WO2006015028 A1 | 2/2006 |

OTHER PUBLICATIONS

Takiar, Hem P. et al., "Memory Card", U.S. Appl. No. 10/851,466, filed May 20, 2004, 45 pages.

Bone, Eric et al., "Storage Device", U.S. Design Appl. No. 29/206,851, filed Jun. 2, 2004, 5 pages.

Cuellar, Edwin J. et al., "Memory Cards Having Two Standard Sets of Contacts", U.S. Appl. No. 10/826,801, filed Apr. 16, 2004, 35 pages.

EPO, "Examiner's First Report," corresponding in European Patent Application No. 05 778 056.1 on May 29, 2007, 4 pages.

USPTO, "Office Action," mailed in related U.S. Appl. No. 11/624,610 on Feb. 12, 2008, 25 pages.

USPTO, "Notice of Allowance and Fee(s) Due," mailed in related U.S. Appl. No. 11/624,610 on Oct. 2, 2008, 12 pages.

* cited by examiner

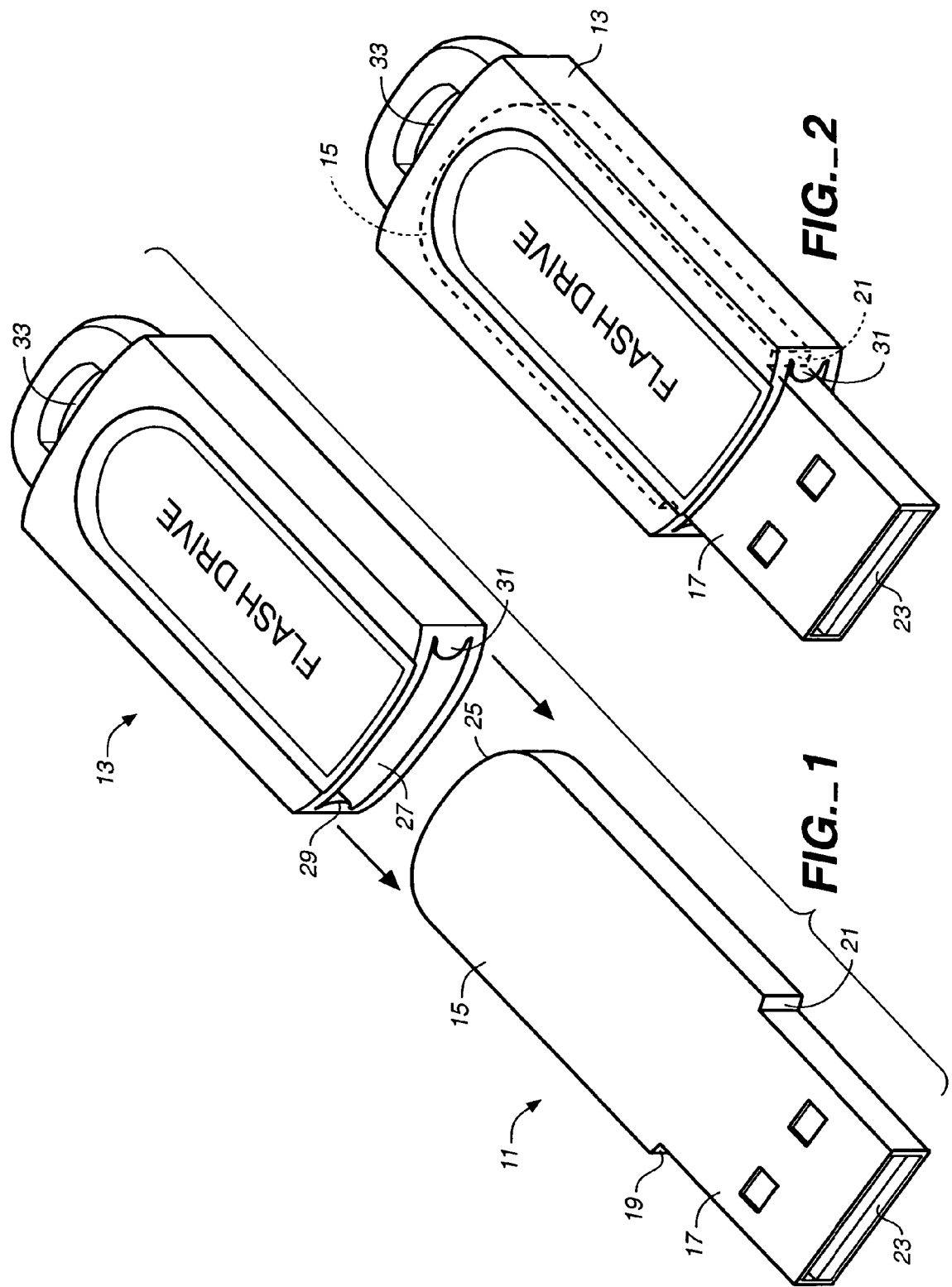

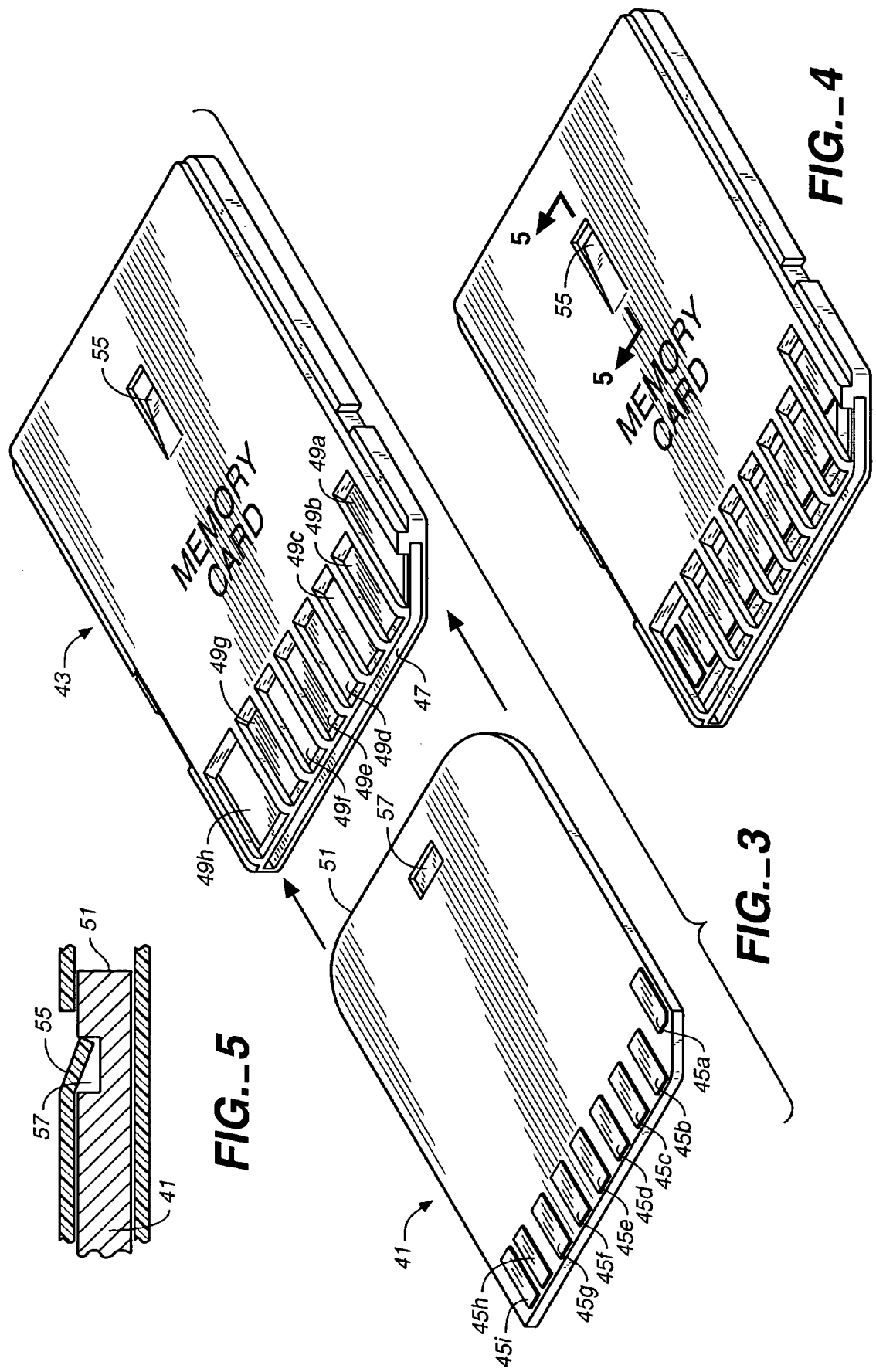

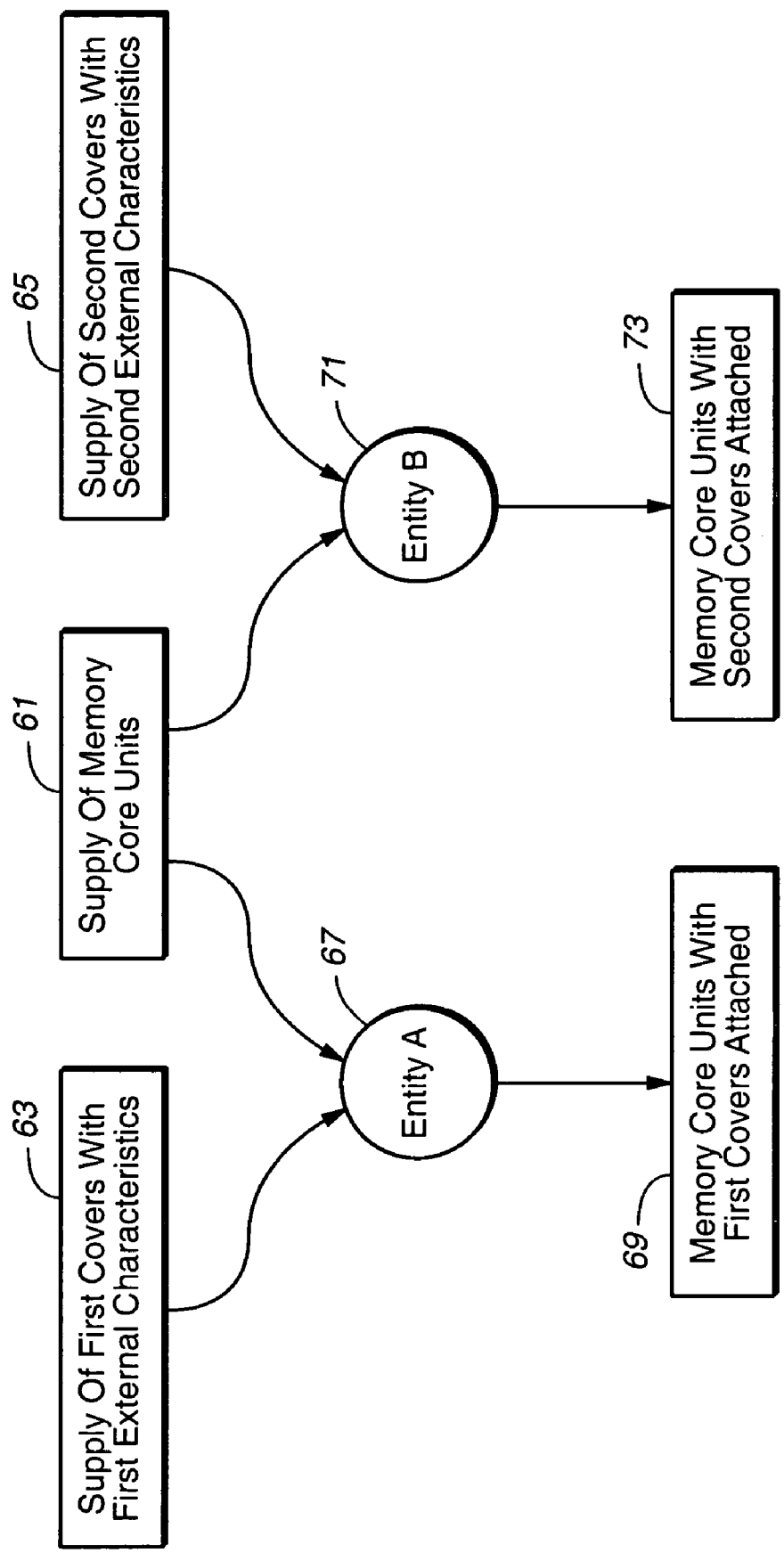
FIG._6

CUSTOMIZED NON-VOLATILE MEMORY DEVICE PACKAGES

CROSS-REFERENCE TO RELATED APPLICATION

This is related to application Ser. No. 10/902,899, entitled "Packaged Memory Devices with Various Unique Physical Appearances," filed concurrently herewith on Jul. 29, 2004 by Brewer et al., now publication no. 2006-0022055 A1. This related application is hereby incorporated herein in its entirety for all purposes by this reference.

BACKGROUND OF THE INVENTION

This invention relates generally to the packaging of small, hand-held portable re-programmable non-volatile memory cards, flash drives and other such devices, and, more specifically, to the ability of an end user, seller or manufacturer to customize the outside surfaces of such devices.

Electronic non-volatile memory cards are used with personal computers, notebook computers, cellular telephones, personal digital assistants (PDAs), digital still cameras, digital movie cameras, portable audio players and other host electronic devices for the storage of large amounts of data. Such cards usually contain a re-programmable non-volatile semiconductor memory cell array along with a controller that controls operation of the memory cell array and interfaces with a host to which the card connected. Flash memory cards have been commercially implemented according to a number of well-known standards. Popular types include Compact-Flash (CF), MultiMediaCard (MMC), Secure Digital (SD), and Memory Stick, each of which is a sold by SanDisk Corporation, the assignee hereof. These portable, hand-held memory cards are small, the largest length being 50 mm., the largest width 36.4 mm. and the largest thickness being 3.3 mm. More recently, even smaller memory cards have come to the marketplace, including the miniSD and TransFlash cards of SanDisk Corporation.

Other small, hand-held re-programmable non-volatile memory devices have also been made to interface with a computer or other type of host by including a Universal Serial Bus (USB) connector plug. These are especially convenient since personal computers, PDAs and other types of hosts commonly include one or more USB connector receptacles but may not have a receptacle slot that accepts any of above identified standard memory cards. There are several USB flash drive products commercially available from SanDisk Corporation under its trademark Cruzer. USB flash drives are typically shaped differently than the memory cards described above but contain memory with the similar amounts of data storage capacity. The mid-sized Cruzer flash drives have an elongated shape with a length of about 70 mm., including the USB connector plug at one end, a width of about 18 mm. and thickness of about 8 mm. The trend is to make flash drives smaller.

The memory card and flash drive devices usually contain markings on an outside surface that typically give the storage capacity of the memory therein, the name and/or trademark of the seller and possibly other design elements that contribute to the overall appearance of the product. The texture and feel of these small hand-held devices can vary depending upon the nature of the outer material being used.

SUMMARY OF THE INVENTION

The ability is provided for manufacturers, sellers and/or end users of small non-volatile memory devices to customize the outside appearance and/or tactile feel of the devices. A common memory core unit is manufactured in large quantities without an outside cover. Covers (skins) are then separately manufactured with a physical configuration that allows them to be easily attached to core units by hand but in different versions having unique external characteristics such as different appearances and/or tactile feel. The covers with the desired external characteristics are then selected for attachment to the core memory units. The types of memory devices that may be configured in this manner include the memory cards and flash drives discussed above in the Background.

This core/cover configuration allows an end user of memory devices to select and customize his or her devices to have a desired look and feel. Memory core units and covers may be sold separately so that the end user may chose the cover for the device. Once purchased, the end user may also replace the initial cover with another cover having different external characteristics without having to replace the memory core unit, which by that time is likely storing data that the end user would not want to lose. Since the covers can be manufactured and sold for a small fraction of the cost of the core memory units, such exchanges are economically viable.

This core/cover configuration also allows original equipment manufacturers (OEMs) and sellers of memory devices to end users to more easily control the outside appearance and feel of their products. Rather than the manufacturer of memory devices doing special manufacturing runs for individual OEMs and re-sellers in order to meet their requirements for individual looking products, large quantities of identical core memory units may be manufactured and then customized to the requirements of the OEMs and re-sellers by covering them with specially manufactured skins. Each cover can be manufactured to show the name, trademark, characteristics of the memory device and additional information specific to a particular OEM or re-seller.

Additional aspects, advantages, features and details of the present invention are included in the following description of exemplary examples thereof, which description should be taken in conjunction with the accompanying drawings.

BRIEF DESCRIPTION OF THE DRAWINGS

FIG. 1 separately shows a flash memory drive and a cover that fits over the device;

FIG. 2 illustrates the flash memory drive and cover of FIG. 1 fit together;

FIG. 3 separately shows a memory card and a cover that fits over the card;

FIG. 4 illustrates the memory card and cover of FIG. 3 fit together;

FIG. 5 is a cross-sectional view of the combination of FIG. 4, taken at section 5-5 thereof; and FIG. 6 is a flow diagram that shows an example use of multiple covers and associated memory devices.

DETAILED DESCRIPTION OF EXEMPLARY EMBODIMENTS

A first embodiment is illustrated in FIGS. 1 and 2. A core memory unit 11 is in the form of a flash drive, such as that utilized in the SanDisk Cruzer flash drive products discussed in the Background. An elongated main body portion 15 includes one or more integrated circuit chips (not shown) providing an array of re-programmable non-volatile memory cells and a memory controller. A USB connector plug 17 extends from one end of the body 15, having the same thickness but a smaller width. The smaller connector 17 is centered across the width of the body 15 in order to form shoulders 19 and 21 on the body 15. The shoulders 19 and 21 are positioned on opposite sides of the connector 17 where it joins the body 15. The memory system within the body 15 is connected to four contacts (not shown) of the USB connector 17, two for power and two for the transfer of data into and out of the memory. These contacts are positioned on the top surface of a dielectric layer 23 within the connector plug 17. An outside of the body 15 and connector 17 are preferably made of a single thin layer of metal, such as aluminum, that has been formed into the shape shown. Top and bottom surfaces extend in planes across both of the body 15 and connector 17. An end 25 of the body 15 is preferably curved, as illustrated in FIGS. 1 and 2, but this end may alternatively be made straight, thereby resulting in the unit 11 being totally rectangular in shape.

A cover 13 is formed to have an inside cavity with a shape complementary to that of the outside surface of the body 15 so that the cover fits tightly around the body when inserted over it. In this embodiment, this cavity is totally enclosed except for an opening 27 through which the end 25 of the body 15 is inserted. Resilient tabs 29 and 31 extend into the cavity at the opening 27 from opposite sidewalls. When the body 15 is inserted through the opening 27 of the cover 13, these tabs 29 and 31 bend backwards until they are positioned in front of the shoulders 19 and 21 of the body 15, at which point the tabs snap outward again to secure the cover 13 on the body 15. The rounded shape of the body end 25 makes this insertion easier but may not always be needed.

The cover 13 is preferably made from plastic, rubber or other moldable material, independently of the flash drive 11. It is also desirable that the cover 13 have some degree of flexibility so that the inside walls of its cavity tightly conform to the outside walls of the body 15, in the nature of a skin for the memory unit body. The walls of the cover 13 are preferably made to have a thickness between 0.5 and 2.0 millimeters in the areas that contact top, bottom and side walls of the body 15. No adhesive need be used to attach the cover 13 to the body 15. The end of the cover opposite its opening 27 may optionally be extended in a manner to form an opening 33 that accepts a neck chain, key ring, and the like, to allow an individual to carry the memory device when the cover is attached.

One of the criteria for choosing a material for the cover 13 is the tactile feel of its outside surface to the user. This tactile feel may also be controlled by treatment of the outside surface of the cover 13, such as its roughening, smoothing, and the like. Two or more covers with a different outside surface feel may be made so that a manufacture, re-seller or end-user may choose among covers with different outside mechanical characteristics, according to personal taste.

Two or more such covers may also be made to have different visual characteristics. The covers may be made of optically transparent material, to have different uniform visible colors, different colors in patterns, and the like. The covers may also have different graphical patterns formed on them, or none at all. Various different indicia may be printed or otherwise applied on different covers, including alpha-numeric characters. In one specific form, the cover 13 may be made of optically transparent material with solid lettering on an outside surface that reflects from and/or casts a shadow on the underlying metal surface of the unit 11, as described in the simultaneously filed patent application cross-referenced above.

An end-user may then choose a cover based on his or her personal taste when purchasing a new memory device, or substitute one cover for another. The tabs 29 and 31 of the cover 13 may be bent outward from the shoulders 21 of the body 11, by the use of fingernails or an appropriate tool, to allow the cover to be pulled off the body. No matter which of many available covers 13 may be chosen for their tactile or visual characteristics, the core memory unit 11 remains the same. The relatively expensive core memory unit 11, when compared to the cover 13, may then be manufactured in large quantities and customized by the end-user, or even by a manufacturer or re-seller of memory devices.

Original equipment manufacturers (OEMs) and re-sellers of memory devices often like to apply their own names, trademarks, and the like, the devices they sell. The separate cover 13 can then be conveniently used for this purpose. An individual OEM or re-seller manufactures, or has manufactured for it, covers with its name and any trademarks on them, which are then attached to the core memory units 11 by hand or a simple machine. Different covers with different graphical designs, trademarks, and the like, or even different tactile feels, may be also be used by a single business for different product lines. In any of these cases, the common core memory units 11 are purchased in bulk without any difference between them except their memory capacity. An OEM or re-seller that attaches customized covers will normally offer two or more memory device products with different data storage capacities of their memories, and therefore at different prices.

As is evident from a second embodiment illustrated in FIGS. 3-5, the same concept can be used with memory cards. In this example, a core memory unit 41 is inserted into a cover 43 (FIG. 3) to result in a Secure Digital (SD) card (FIG. 4), a commercial form of memory card. The core memory unit 41 contains the one or more integrated circuit chips necessary to form the data storage system. The unit 41 is preferably made of molded plastic. The electronic system communicates to the outside world through nine electrical contacts 45*a-i* attached to a surface of the unit 41 along one end thereof. A cavity within the cover 43 has a shape that is complementary to the core unit 41, with an opening 47 into which the core unit 41 is inserted from an end 51 that is opposite to the end carrying the contacts 45. Eight apertures 49*a-h* exist in a top wall of the cover 43, opening to the cavity within, at positions aligned with the contacts 45*a-i* of the core unit 41. The contacts 45*a-i* are then accessible through respective apertures 49*a-h* when the core unit 41 is positioned within the cover 43 (aperture 49*h* exposes two contacts 45*h* and 45*i*), as shown in FIG. 4. Walls between the apertures define recesses for the contacts, according to specifications of the SD memory card.

In order to retain the core unit 41 within the cover 43, in this specific example, the top surface of the cover includes a resilient detent 55 that normally depends downward into the cavity within. This is best seen by the cross-sectional view of FIG. 5. The core memory unit 41 has a recess 57 in its top surface into which the detent 55 snaps when the unit 41 is inserted into the cover 43 through its end opening 47. The relative positions of the detent 55 and recess 57 are such that the unit 41 is maintained fully within the cavity of the cover 43, with the unit surface contacts 45*a-i* aligned with the corresponding apertures 49*a-h* of the cover. The core memory unit 41 may be released by the use of a small tool to raise the detent up out of the unit's recess 57, which then allows the unit 41 to be withdrawn from the cover 43. Travel of the core unit 41 into the cavity of the sleeve 43 through the opening 47 is restrained by an appropriate stop or end surface (not shown) formed in the cavity.

Different covers 43 can then be provided for use with the same core units 41, in the same manner as described above with respect to the first embodiment. Individual covers are made to have a visual appearance, tactile feel, and other external characteristics according to the tastes and desires of any of an end-user, a re-seller, an OEM or a manufacturer. In one specific form, the cover 43 may be made of optically transparent material with solid lettering on an outside surface that reflects from and/or casts a shadow on the surface of the core unit 41, as described in the simultaneously filed patent application cross-referenced above. According to that cross-referenced application, reflective foil would be attached to the surface of the core memory unit 41, which would then be visible through the cover 43. This foil may include a hologram on its exposed surface, such as a diffusely reflecting rainbow hologram.

A chart of FIG. 6 illustrates some of the commercial possibilities presented by use of covers separate from core memory units. A common supply 61 of memory core units (core 11 of FIGS. 1-2, or core 41 of FIGS. 3-5, as examples) having a particular data storage capacity are used to form complete memory devices. A supply 63 of first covers (respective cover 13 of FIGS. 1-2, or cover 43 of FIGS. 3-5, as examples) provides one choice to be combined with the core units. A supply 65 of second covers provides another choice. The first and second covers are different in some outer characteristic, such as their visual appearances, tactile feel, and others discussed above.

An entity A (67) then forms complete memory devices, indicated at 69, by placing the covers of 63 on the core units of 61. Similarly, an entity B (71) places the covers of 65 onto the same core units of 61 to form complete memory devices, as indicated at 73, that therefore have perceptually different outer characteristics than the memory devices indicated at 69. The entities A and B may be different end-user individuals that have customized their memory devices to their different tastes. Or the entities A and B can be different businesses that manufacture or sell complete memory devices, and which have customized the outer characteristics to their different business requirements.

Although the various aspects of the present invention have been described with respect to specific exemplary embodiments thereof, it will be understood that the present invention is entitled to protection within the full scope of the appended claims.

It is claimed:

1. A method of forming a memory device with customized outside characteristics, which comprises:
utilize a core unit including a housing with electrical contacts accessible from the outside of the housing at one end thereof and operably connected to a re-programmable non-volatile memory enclosed within the housing,
select one of two or more covers that are individually slidable over an outside surface of the housing from an end thereof opposite said one end to surround the housing at least adjacent said opposite end without restricting access to the electrical contacts from outside of the housing, wherein the two or more covers (1) are individually slidable off of the housing from said opposite end and (2) have different external indicia selected from a group consisting of alpha-numeric characters and graphical patterns, and
slide said one cover over the housing from said opposite end thereof, thereby to customize the core memory unit with said one cover.

2. The method according to claim 1, wherein the method is carried out by end users of the memory unit.

3. The method according to claim 1, wherein the method is carried out by sellers of the memory unit.

4. A method assembling memory devices, comprising:
first and second entities acquire core memory units having a re-programmable non-volatile memory therein connected to electrical contacts that are externally accessible,
the first entity obtains first covers that are individually slidable over and around the core memory units from one end thereof without restricting access to the electrical contacts and which have first permanently attached indicia on an outside surface thereof,
the second entity obtains second covers that are slidable over and around the core memory units from one end thereof without restricting access to the electrical contacts and which have second permanently attached indicia on an outside surface thereof that is distinct from the first indicia,
the first entity slides a plurality of the first covers over a first plurality of core units from said one end thereof, thereby resulting in a first plurality of memory devices with the first indicia on the outside thereof, and
the second entity slides a plurality of the second covers over a second plurality of core units from said one end thereof, thereby resulting in a second plurality of memory devices with the second indicia on the outside thereof;
whereby the core memory units are customized according to desires of the first and second entities.

5. The method of claim 4, wherein the first and second indicia include respective indications of the sources of the first and second entities.

6. The method of claim 4, wherein the core memory units are elongated flash drives with electrical contacts within a USB connector plug at one end and the covers are slid over the memory units from an end opposite to that of the USB connector to cover the core units except for the USB connector plug.

7. The method of claim 4, wherein the core memory units are memory cards with contacts positioned at one end on an outside surface thereof and the covers are slid over the memory units from an end opposite to that where the contacts are positioned.

8. The method of claim 7, wherein the covers include openings therethrough that are positioned over the contacts when slid onto the memory cards.

9. The method of claim 4, wherein the first and second plurality of memory devices are sold by the respective first and second entities to end users of the devices.

10. The method according to claim 1, additionally comprising thereafter removing said one cover from the core unit.

11. The method according to claim 10, additionally comprising:
select another of the two or more covers having external indicia that is different from that of said one cover, and
slide said another cover over the core unit, thereby to customize the core memory unit with said another cover.

12. A method of customizing a flash drive memory device with selected outside characteristics, comprising:
utilizing an elongated body with an electrical connector according to a USB standard extending from a first end thereof and operably connected to a re-programmable non-volatile flash memory on the inside of the body, the body also having a second end opposite the first end,
selecting one of two or more sleeves that each have an internal cavity open at a first end and closed at a second end to form walls that tightly conform to outside surfaces of the memory device body between the body's first and second ends when the sleeve is positioned over the body, wherein the two or more sleeves have at least one different indicia on at least one of the walls thereof that is selected from a group consisting of color, alpha-numeric characters and graphical patterns, and positioning the second end of the body into the cavity of the selected sleeve through the sleeve's first end and sliding the sleeve over the body a distance to cover the body without extending over the electrical connector, thereby to customize the flash memory device with said one sleeve.

13. The method according to claim 12, wherein the method is carried out by end users of the memory unit.

14. The method according to claim 12, wherein the method is carried out by sellers of the memory unit.

15. The method according to claim 12, wherein selecting one of two or more. sleeves includes selecting one of two or more sleeves that are additionally removable from the body at its second end.

16. The method according to claim 12, wherein selecting one of two or more sleeves comprises selecting from two or more sleeves that have at least one different indicia on at least one of the walls thereof that is selected from a group consisting of alpha-numeric characters and graphical patterns.

17. The method according to claim 12, additionally comprising:

removing the selected sleeve from the body by sliding the selected sleeve off the second end of the body, and selecting another of the two or more sleeves that has at least one different indicia from that of the selected sleeve being removed from the body, and positioning the second end of the body into the cavity of said another sleeve through the first end of said another sleeve and sliding the sleeve over the body a distance to cover the body without extending over the electrical connector, thereby to customize the flash memory device with an appearance that has been changed to that of said another sleeve.

* * * * *